United States Patent [19]

Desai et al.

[11] Patent Number: 4,788,767

[45] Date of Patent: Dec. 6, 1988

[54] METHOD FOR MOUNTING A FLEXIBLE FILM SEMICONDUCTOR CHIP CARRIER ON A CIRCUITIZED SUBSTRATE

[75] Inventors: Kishor V. Desai, Vestal; Kohn Harold, Endwell, both of N.Y.

[73] Assignee: International Business Machines Corporation, Armonk, N.Y.

[21] Appl. No.: 24,491

[22] Filed: Mar. 11, 1987

[51] Int. Cl.$^4$ .............................................. H05K 3/36
[52] U.S. Cl. ......................................... 29/830; 29/840
[58] Field of Search .......................... 29/840, 825, 830; 174/68.5; 361/403, 413

[56] References Cited

U.S. PATENT DOCUMENTS

| | | |
|---|---|---|
| 3,292,240 | 12/1966 | McNutt et al. . |
| 3,303,393 | 2/1967 | Hymes et al. . |
| 3,312,325 | 4/1967 | Beck et al. . |
| 3,320,658 | 5/1967 | Bolda et al. . |
| 3,339,704 | 9/1967 | Clark et al. . |
| 3,367,476 | 2/1968 | Aronstein et al. . |
| 3,373,481 | 3/1968 | Lins et al. . |
| 3,387,365 | 6/1968 | Stelmak et al. . |
| 3,392,442 | 7/1968 | Napier et al. . |
| 3,461,357 | 8/1969 | Mutter et al. . |
| 3,646,670 | 3/1972 | Maeda et al. . |
| 3,795,047 | 3/1974 | Abolafia et al. . |
| 3,871,015 | 3/1975 | Lin et al. . |
| 4,231,154 | 11/1980 | Gazdik et al. . |
| 4,251,852 | 2/1981 | Ecker et al. . |
| 4,329,779 | 5/1982 | England . |
| 4,377,316 | 3/1983 | Ecker et al. . |
| 4,480,288 | 10/1984 | Gazdik et al. . |
| 4,512,509 | 4/1985 | Ellis, Jr. et al. . |
| 4,517,051 | 5/1985 | Gazdik et al. . |
| 4,549,200 | 10/1985 | Ecker et al. . |
| 4,628,408 | 12/1986 | Kimura . |
| 4,642,889 | 2/1987 | Grabbe .................................. 29/840 |
| 4,692,843 | 9/1987 | Matsumoto et al. . |

OTHER PUBLICATIONS

"CCMD Provides Reliable Assembly of Chip Carriers to PCBs", *Materials Engineering*, p. 43, (Nov. 1984), and Raychem Chip Carrier Mounting Device (CCMD) Specifications (not dated).

Gazdik, et al., "Processing PC Conductor Decals", *IBM Technical Disclosure Bulletin*, vol. 21, No. 11, Apr. 1979, p. 4425, (International Business Machines Corporation, Armonk, New York, 10504).

D. P. Seraphim and I. Feinberg, Electronic Packaging Evolution in IBM, *IBM Journal of Research and Development*, vol. 25, No. 4, Sep. 1981, p. 620, (published by International Business Machines Corporation, Armonk, NY 10504).

*Primary Examiner*—Howard N. Goldberg
*Assistant Examiner*—Carl J. Arbes
*Attorney, Agent, or Firm*—David L. Adour

[57] ABSTRACT

A method and apparatus are disclosed for mounting a flexible film semiconductor chip carrier on a second level electronic package, such that the flexible film of the carrier is supported substantially in a plane above the surface of the second level electronic package. The method comprises positioning preformed spacers embedded in a dissolvable polysulfone foam holder between the outer lead bonding pads on the flexible film semiconductor chip carrier and corresponding (matching) bonding pads on the second level electronic package. Each of the preformed spacers may comprise, for example, a solder cylinder with a copper core. The preformed spacers may be bonded to the outer lead bonding pads on the chip carrier, and to the matching bonding pads on the second level electronic package, by reflowing the solder of the spacers using, for example, a conventional solder reflow oven. Then, the holder is dissolved, and washed away, in a conventional vapor degreaser using, for example, methylene chloride, to leave the flexible film semiconductor chip carrier mounted on the second level electronic package with the flexible film of the carrier having a planar geometry as desired.

10 Claims, 2 Drawing Sheets

METHOD FOR MOUNTING A FLEXIBLE FILM SEMICONDUCTOR CHIP CARRIER ON A CIRCUITIZED SUBSTRATE

BACKGROUND OF THE INVENTION

The present invention relates to electronic packaging, and more particularly relates to a method and apparatus for mounting a flexible film semiconductor chip carrier on a circuitized substrate such as a printed circuit card or board.

Typically, one or more semiconductor chips, or other such electronic devices, are mounted on a first circuitized substrate (called a semiconductor chip carrier, or, more generally, a first level electronic package), which, in turn, is mounted on a second circuitized substrate, such as a printed circuit card or board (more generally called a second level electronic package). The electronic device(s) mounted on the first level electronic package are electrically connected through the circuitry of the first level package to the circuitry of the second level electronic package. The resulting structure may be used as part of a computer or other such equipment.

A particularly versatile first level electronic package is a flexible film semiconductor chip carrier, for example, as described in U.S. patent application Ser. No. 865,316, entitled "Flexible Film Semiconductor Chip Carrier", which was filed in the U.S. Patent and Trademark Office on May 21, 1986, and which is assigned to International Business Machines (IBM) Corporation as is the present patent application. Also, see United States patent application Ser. No. 009,981, entitled "Full Panel Electronic Packaging Structure and Method of Making Same", which was filed in the U.S. Patent and Trademark Office on Feb. 2, 1987, and which is also assigned to IBM Corporation. (The entire disclosures of these two U.S. patent applications are incorporated herein by reference.) This type of first level electronic package comprises a circuitized, flexible substrate, such as a relatively thin sheet of polyimide having a thickness between approximately 5.1 to 7.6 micrometers (about 0.0002 to 0.0003 inch) and having circuitry formed on at least one side of the polyimide sheet. A semiconductor chip, or other such electronic device, may be mounted on pads, such as controlled collapse chip connection (C-4) pads, which are part of the circuitry formed on the polyimide sheet, and then the resulting structure may be mounted on a printed circuit board, or other such second level electronic package.

Conventional techniques such as solder reflow, ultrasonic bonding, or thermal compression bonding may be used to mount the flexible film semiconductor chip carrier on the second level electronic package with the semiconductor chip backbonded to the second level package. However, each of these techniques results in a non-planar ("tent") geometry for the circuitized, flexible film carrying the semiconductor chip, when the flexible film semiconductor chip carrier is mounted on the second level electronic package. Such a tent geometry for the circuitized, flexible film raises reliability concerns because stresses may be imposed on the circuitry on the flexible film, or on joints, such as C-4 joints between the semiconductor chip and C-4 pads on the flexible film, during the process of mounting the film on the second level electronic package, or during subsequent use of the resulting electronic packaging structure. In addition, such a tent geometry for the circuitized, flexible film presents problems such as difficulty in aligning outer bonding pads on the flexible film with mating pads on the second level package, difficulty in making sufficiently strong bonds between the flexible film and the second level package to hold the flexible film in position and prevent it from springing up, difficulty in preventing electrical shorting between the circuitry on the flexible film and the edges of the semiconductor chip over which the film is draped, and difficulty in adequately cleaning under the film once it is in position on the second level electronic package.

A planar geometry for the circuitized, flexible film is very desirable since it eliminates or alleviates the foregoing concerns and problems, and one solution is to provide a cavity in the second level electronic package which accommodates the semiconductor chip mounted on the circuitized, flexible film, thereby allowing the flexible film to assume the desired planar geometry. However, this solution is not particularly desirable since, for example, it decreases the wireability of the second level package. Also, placing the semiconductor chip in a cavity presents a flux cleaning problem.

Another solution which provides the desired planar geometry for the circuitized, flexible film is to mount the circuitized, flexible film semiconductor chip carrier on the second level electronic package using the method and apparatus which is the subject matter of U.S. patent application Ser. No. 024,499, entitled "Method And Apparatus For Mounting A Flexible Film Semiconductor Chip Carrier On A Circuitized Substrate", which is being filed in the U.S. Patent and Trademark Office on the same day as the present patent application, and which is assigned to International Business Machines Corporation, as is the present patent application. The entire disclosure of the foregoing patent application is incorporated herein by reference. However, there may be situations in which it is desired to mount a circuitized, flexible film semiconductor chip carrier on a second level electronic package with the circuitized, flexible film having a planar geometry, using a method and apparatus other than the method and apparatus which is the subject matter of the previously cited U.S. patent application. For example, especially in a high volume manufacturing environment, for cost, or other reasons, it may be desirable to have an alternative to the method and apparatus which is the subject matter of the previously cited U.S. patent application.

SUMMARY OF THE INVENTION

Therefore, it is an object of the present invention to provide an electronic packaging structure wherein a flexible film semiconductor chip carrier is mounted on a second level electronic package such that the circuitized, flexible film of the carrier is substantially planar when mounted on the second level electronic package, without providing a cavity in the second level package.

Also, it is an object of the present invention to provide a method and apparatus (which is an alternative to the method and apparatus which is the subject matter of U.S. patent application Ser. No. 024,499, entitled "Method and Apparatus For Mounting A Flexible Film Semiconductor Chip Carrier On A Circuitized Substrate", referenced previously) for simply and reliably mounting a flexible film semiconductor chip carrier on a second level electronic package such that the circuitized, flexible film of the carrier is substantially planar when mounted on the second level electronic package, without providing a cavity in the second level electronic package.

These and other objects of the present invention are attained by positioning an electrically conductive spacer between each outer lead bonding pad on a flexible film semiconductor chip carrier and its corresponding (matching) bonding pad on a second level electronic package on which the carrier is to be mounted. Each spacer has a height approximately equal to the height of the semiconductor chip, or other such electronic device, which is to be mounted on the flexible film. Thus, the spacers physically support the flexible film substantially in a plane above the surface of the second level electronic package, as desired, when the flexible film semiconductor chip carrier is mounted on the second level electronic package with the semiconductor chip backbonded to the surface of the second level electronic package. Also, the spacers electrically connect the outer lead bonding pads of the circuitry on the flexible film to the matching bonding pads on the second level electronic package.

Preferably, each of the spacers is a solder cylinder with a copper core. A special removable holder is used to hold the spacers in position for attachment to the outer lead bonding pads of the circuitry on the flexible film of the flexible film semiconductor chip carrier. After the spacers are attached to the outer lead bonding pads of the circuitry on the flexible film of the flexible film semiconductor chip carrier, the carrier with the spacers in the holder attached thereto, is positioned on the second level electronic package, with each of the spacers in contact with its matching bonding pad on the second level electronic package. Then, the spacers are bonded to the matching bonding pads on the second level electronic package, and the holder is removed, leaving the flexible film semiconductor chip carrier mounted on the second level electronic package with the flexible film of the carrier supported by the spacers in a planar configuration as desired. Preferably, the holder is made of a dissolvable material, such as polysulfone foam, which may be dissolved in a vapor degreaser using a liquid, such as methylene chloride.

BRIEF DESCRIPTION OF THE DRAWINGS

Other objects and advantages of the present invention will be apparent from the following description in conjunction with the accompanying drawing, in which like reference numerals identify like elements, and in which.

DESCRIPTION OF THE PREFERRED EMBODIMENT

Figure 1:
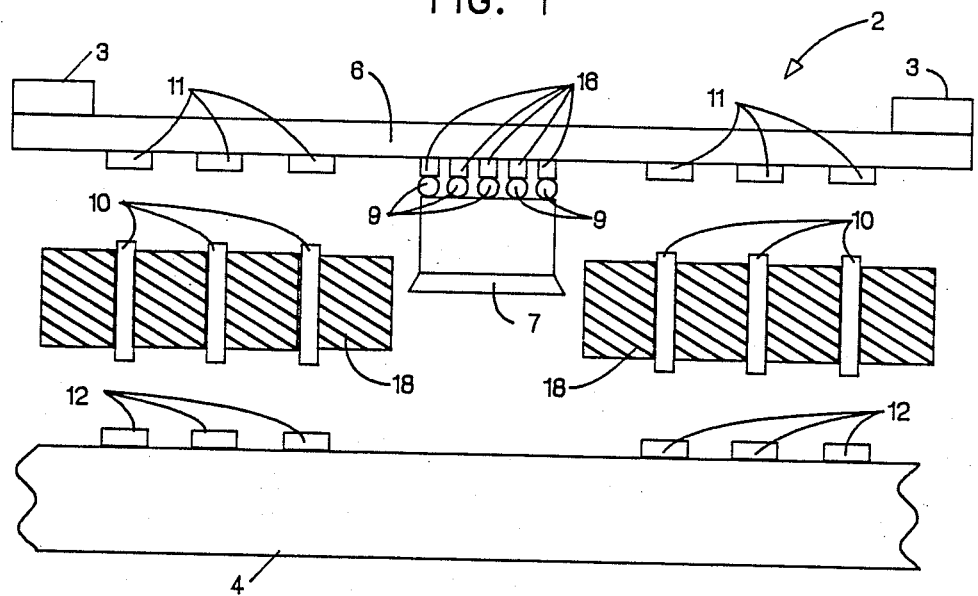
FIG. 1 is an exploded, cross-sectional view of a flexible film semiconductor chip carrier mounted on a printed circuit board using preformed spacers embedded in a removable holder, according to the principles of the present invention.
Figure 2:
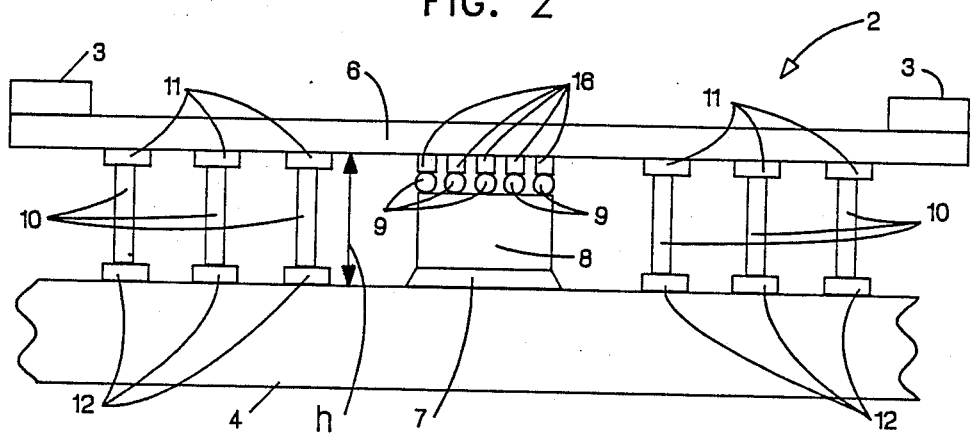
FIG. 2 is a non-exploded, cross-sectional view of the electronic packaging structure shown in FIG. 1 after the holder for the preformed spacers has been removed.

Referring to FIGS. 1 and 2, cross-sectional views are shown of a flexible film semiconductor chip carrier 2 which is mounted on a printed circuit board 4 using preformed spacers 10 embedded in a removable holder 18, to form an electronic packaging structure according to the principles of the present invention. As shown in FIGS. 1 and 2, the flexible film semiconductor chip carrier 2 comprises a frame 3 holding a flexible film 6 with circuitry (not shown) on at least one side of the film 6. A semiconductor chip 8 is mounted on the carrier 2 and backbonded to the printed circuit board 4. As shown in FIG. 1, controlled collapse chip connections (C-4's) 9 are used to mount the semiconductor chip on inner lead bonding pads 16 of the circuitry (not shown) on the flexible film 6 of the flexible film semiconductor chip carrier 2. The semiconductor chip 8 is backbonded to the circuit board 4 using an interposer 7 made of a material, such as a metal, for facilitating heat transfer between the semiconductor chip 8 and the circuit board 4, and for alleviating thermal coefficient of expansion mismatches between the chip 8 and the circuit board 4. Electrically conductive spacers 10 between outer lead bonding pads 11 of the circuitry on the flexible film 6 and bonding pads 12 of the circuitry on the circuit board 4, physically support the flexible film 6 substantially in a plane above the surface of the circuit board 4, and electrically interconnect the outer lead bonding pads 11 of the circuitry on the flexible film 6 and the bonding pads 12 of the circuitry on the circuit board 4.

The printed circuit board 4 may be made in any one of a number of different ways, and may be composed of combinations of a number of different materials. For example, the printed circuit board 4 may be made of layers of glass cloth impregnated with epoxy resin or other such dielectric material, with circuitry (not shown) formed on the top surface of the board 4 and/or between the layers of dielectric material making up the board 4. Preferably, at least one layer of the printed circuit board 4 is a ground plane (not shown) providing a ground return for the wires (circuit lines) on the circuitized, flexible film 6 of the flexible film semiconductor chip carrier 2 which is mounted on the printed circuit board 4.

Basically, the printed circuit board 4 may have virtually any desired size and shape, as long as there is at least one area of the board 4 suitable for mounting the flexible film semiconductor chip carrier 2 on the printed circuit board 4. Preferably, the area on the printed circuit board 4 for mounting the flexible film semiconductor chip carrier 2 on the printed circuit board 4 is a substantially planar area. Also, it should be noted that although the present invention is described with respect to mounting the flexible film semiconductor chip carrier 2 on a printed circuit board 4, the present invention is broadly directed to mounting the flexible film semiconductor chip carrier 2 (a first level electronic package) on virtually any second circuitized substrate (second level electronic package).

Further, it should be noted that although the present invention is described with respect to the flexible film semiconductor chip carrier 2 carrying a semiconductor chip 8, the carrier 2 may carry any one, or a plurality, of a number of different electronic devices, such as resistors and/or capacitors, in addition to, or in lieu of, the semiconductor chip 8. Further, it should be noted that, as shown in FIG. 1, preferably, the semiconductor chip 8 is mounted on the flexible film semiconductor chip carrier 2 using controlled collapse chip connections (C-4's) 9. However, if desired, the semiconductor chip 8, and/or other electronic devices, may be mounted on the flexible film semiconductor chip carrier 2 by using a thermal compression bonding technique, or other such technique.

Preferably, the circuitry on the printed circuit board 4 comprises copper circuit lines each approximately 76.2 micrometers wide (about 0.003 inch), and having a height (thickness) of approximately 35.6 micrometers (about 0.0014 inch).

However, it should be noted that the width and thickness of the circuit lines may vary depending on factors such as the capabilities of the process used to form the circuitry on the printed circuit board 4, the planned use for the circuitry, and the performance characteristics expected of the circuitry and of the overall electronic packaging structure.

As mentioned previously, the interposer 7 is provided for facilitating heat transfer between the semiconductor chip 8 and the circuit board 4, and for alleviating thermal coefficient of expansion mismatches between the chip 8 and the circuit board 4. For example, if the semiconductor chip 8 is made primarily of a material such as silicon, and the circuit board 4 is made primarily of a material such as glass cloth impregnated with epoxy resin, then the interposer 7 may be made of a metal, such as a copper clad "INVAR" material sold by Texas Instruments, Inc. having a place of business in Dallas, Tex., which has a coefficient of thermal expansion between the coefficient of thermal expansion of silicon and the coefficient of thermal expansion of glass cloth impregnated with epoxy resin. Thus, the copper clad "INVAR" material of the interposer 7 would act as a thermal coefficient of expansion "bridge" between the silicon of the semiconductor chip 8 and the glass cloth impregnated with epoxy resin of the circuit board 4, to alleviate the thermal coefficient of expansion mismatch between the chip 8 and the circuit board 4. Also, the interposer 7 facilitates rework if the interposer 7 is attached to the surface of the printed circuit board 4 by soldering, since the semiconductor chip 8, and the interposer 7, can be easily removed from the surface of the printed circuit board by heating.

The interposer 7 may be attached to the semiconductor chip 8, using thermally conductive epoxy, before the flexible film semiconductor chip carrier 2 is mounted on the circuit board 4. Then, the interposer 7 may be attached to printed circuit board 4 by soldering, at the same time the flexible film semiconductor chip carrier 2 is mounted on the circuit board 4.

However, it should be noted that, in certain situations, it may be desirable to backbond the semiconductor chip 8 directly to the surface of the printed circuit board 4, without using the interposer 7. For example, if the printed circuit board 4 is made of a material(s) having a coefficient of thermal expansion which closely matches the coefficient of thermal expansion of the semiconductor chip 8 which is to be backbonded to the circuit board 4, and rework requirements are not of great concern, then it may be desirable to backbond the semiconductor chip 8 directly to the surface of the printed circuit board 4 by soldering, by using a thermally conductive epoxy, or by using another such suitable technique.

The frame 3 is a square, ring like structure, attached to the edges of the flexible film 6 of the flexible film semiconductor chip carrier 2, and may include locating holes (not shown) for registration of the flexible film 6 during manufacture of the flexible film 6 on the frame 3, and during mounting of the flexible film semiconductor chip carrier 2 on the printed circuit board 4. If desired, slots or notches in the frame 3, or other such means, may be used to perform this registration. The frame 3 has dimensions compatible with the dimensions of the flexible film 6. For example, if the flexible film 6 is approximately a 44.1 millimeter (about 1.735 inch) square, then the frame 3 may be a square ring having an approximately 44.1 millimeters (about 1.735 inches) square outside edge, a height (thickness) of approximately 1.6 millimeters (about 0.062 inch), and a frame width of virtually any dimension which, preferably, does not overlap any of the circuitry on the flexible film 6 of the flexible film semiconductor chip carrier 2.

The primary function of the frame 3 is to facilitate handling of the flexible film semiconductor chip carrier 2 during its manufacture and during the mounting of the carrier 2 on the circuit board 4. Preferably, after the flexible film semiconductor chip carrier 2 is mounted on the printed circuit board 4, the frame 3 is removed from the flexible film 6, for example, by cutting the frame 3 away from the flexible film 6. This prevents potential movements of the frame 3 from adversely affecting the inner lead bonds between the semiconductor chip 8 and the circuit board 4, and the outer lead bonds (spacers 10) between the flexible film 6 and the circuit board 4 after the flexible film semiconductor chip carrier 2 has been mounted on the circuit board 4. Of course, if the frame 3 is so small (thin) that its potential movement is not of concern relative to the integrity of the inner and/or outer lead bonds, then it may not be necessary to remove the frame 3. Also, if there is some further purpose which the frame 3 may serve after the flexible film semiconductor chip carrier 2 has been mounted on the circuit board 4, then the frame 3 may be left in place, if desired.

Although the frame 3 is shown as a ring like structure in FIGS. 1 and 2, the frame 3 may have any one of a number of different configurations, and may be made of any one of a number of different materials, or combinations of different materials. Basically, the frame 3 should have the following characteristics. It should be substantially chemically inert to chemicals which may be used in expose, develop, etch, clean, or other such processes, used in forming the circuitry on the flexible film 6. Also, the frame 3 should be rigid, or semi-rigid, in the sense that it will lay substantially flat on a planar surface such that all of its perimeter is effectively in contact with the planar surface. In addition, the frame 3 should be able to withstand bonding temperatures which may be reached when bonding the spacers 10 to the outer lead bonding pads 11 of the circuitry on the flexible film 6, or to the outer lead bonding pads 12 of the circuitry on the printed circuit board 4. Finally, the frame 3 should be able to withstand chip joining process temperatures which may be reached when joining the semiconductor chip 8, or other such electronic device(s), to inner lead bonding pads 16 of the circuitry on the flexible film 6.

For example, the frame 3 may comprise a square, or rectangular, ring like structure made of relatively thin aluminum having a thickness, for example, of between approximately 50.8 micrometers (about 0.002 inch) and 7.8 micrometers (about 0.007 inch). This relatively thin aluminum comprising the frame 3 may be a portion of a temporary full panel, planar aluminum support on which the circuitized, flexible film 6 is first made, and which has been removed except for that part of the aluminum support which is to remain as the frame 3. For example, the undesired portion of the aluminum support may have been removed by etching away the aluminum in hydrochloric acid with a photoresist, or other such, mask protecting that part of the aluminum support which is to remain as the frame 3.

Alternatively, the frame 3 may comprise a square, or rectangular, ring like structure made of relatively thin aluminum, as described above, mounted on a thicker matching ring structure of titanium. For example, the titanium may have a thickness of approximately 1.6 millimeters (about 0.062 inch). The relatively thin aluminum ring like structure may be mounted on the thicker titanium ring like structure by adhesive lamination. This combination aluminum-titanium structure may be preferred in certain situations since the coefficient of thermal expansion of titanium is compatible with glass cloth impregnated with epoxy resin, or other such material, which is likely to be the primary material comprising the circuit board 4. However, as noted previously, the frame 3 may be made of any one of a number of different materials, or combinations of different materials, including materials such as stainless steel, copper, polysulfone, and/or polyimide material such as the polyimide material sold under the trademark "KAPTON" by E. I. Du Pont de Nemours and Company having a place of business at 1007 Market Street, Wilmington, Del.

Preferably, the flexible film 6 comprises a relatively thin sheet of polyimide having a thickness, for example, between approximately 5.1 to 7.6 micrometers (about 0.0002 to 0.0003 inch), and having circuitry formed on at least one side of the polyimide sheet, for example, as described in U.S. patent application Ser. No. 865,316, entitled "Flexible Film Semiconductor Chip Carrier", which was filed in the U.S. Patent and Trademark Office on 5/21/86, and which is assigned to International Business Machines Corporation as is the present patent application. However, it should be noted that depending on the product which it is desired to produce, the application for that product, and other such factors, it may be desirable to use material(s) other than polyimide for the flexible film 6. For most applications, when using a polyimide sheet as the flexible film 6, the polyimide sheet should have a thickness less than approximately 12.7 micrometers (about 0.0005 inch) to provide stress relief during thermal cycling of the polyimide when manufacturing and using the electronic packaging structure according to the principles of the present invention. This polyimide sheet may have a length and width of any dimensions which can be handled in the process used to manufacture the flexible film semiconductor chip carrier 2. However, the polyimide should not be so thin that it loses its structural integrity such that it cannot function as a structurally continuous dielectric layer. For some applications, it may be desirable for the polyimide sheet to have a thickness between approximately 12.7 and 25.4 micrometers (about 0.0005 and 0.001 inch). However, to provide the thermal stress relief mentioned previously, especially when using controlled collapse chip connections (C-4's) 9 between the semiconductor chip 8 and the inner lead bonding pads 16 of the circuitry on the flexible film 6, it is preferred that the polyimide not have a thickness greater than approximately 25.4 micrometers (about 0.001 inch). When using other types of interconnections between the semiconductor chip 8 and the inner lead bonding pads 16 of the circuitry on the flexible film 6, it may be feasible, and desirable, in certain situations, to use a thicker sheet of polyimide as the flexible film 6. For example, if a thermal compression bonding technique is used to make the interconnections between the semiconductor chip 8 and the inner lead bonding pads 16 of the circuitry on the flexible film 6, then the polyimide sheet forming the flexible film 6 may have a thickness of up to approximately 127.0 micrometers (about 0.005 inch).

The polyimide forming the flexible film 6 may be any one of a number of specific materials. For example, "5878" polyimide, which is a polymer formed from the monomers pyromellitic dianhydride and oxydianiline (commonly referred to as "PMDA-ODA"), available from E. I. Du Pont de Nemours and Company, may be used. This "5878" polyimide is a thermo set condensation polymer polyimide, which is basically a high temperature, elastic material. That is, it is capable of withstanding processing temperatures up to approximately four-hundred degrees centigrade, and may be stretched.

Preferably, the circuitry (not shown) on the flexible film 6 is relatively fine line circuitry with the individual circuit lines having a height (thickness) of approximately 7.6 micrometers (about 0.0003 inch) and a width of approximately 25.4 micrometers (about 0.001 inch). However, it should be noted that the thickness and width of the circuit lines may vary depending on factors such as the capabilities of the process used to form the circuitry on the flexible film 6, the planned use for the circuitry, and the performance characteristics expected of the circuitry and of the overall electronic packaging structure.

Also, preferably, the circuitry on the flexible film 6 comprises a chromium/copper/chromium (Cr/Cu/Cr) metallurgical system which is personalized using photolithographic and etching techniques such as described in U.S. Pat. Nos. 4,231,154, 4,480,288 and 4,517,051, which are assigned to International Business Machines Corporation, Armonk, N.Y., as is the present patent application. The entire disclosures of each of these three United States patents are incorporated herein by reference. The flexible film 6 may have circuitry formed on only one side, or, if desired, the flexible film 6 may have circuitry on both sides with interconnecting vias as described, for example, in the previously noted U.S. Pat. Nos. 4,480,288 and 4,517,051.

As shown in FIGS. 1 and 2, the circuitry on the flexible film 6 includes the inner lead bonding pads 16 for use in mounting the semiconductor chip 8, or other such electronic device(s), on the flexible film 6, and the outer lead bonding pads 11 for use in mounting the flexible film semiconductor chip carrier 2 on the printed circuit board 4 according to the principles of the present invention. Preferably, each of the outer lead bonding pads 11, and inner lead bonding pads 16, is made of copper, coated with a layer of gold to facilitate the bonding of the spacers 10, and the C-4's 9, to the pads 11 and 16, respectively. However, if desired, for example, for economic, or for other reasons, the pads 11 and 16 may be made of just copper, or they may be made of any one of a variety of other such conductive material(s) which will be readily apparent to one of ordinary skill in the art to which the present invention pertains.

The inner lead bonding pads 16, and the outer lead bonding pads 11, on the flexible film 6, may have virtually any desired size, and/or configuration, such as round, oblong, square, rectangular, etc. The considerations relative to the size and configuration of the bonding pads 11 and 16, are factors such as the intended use (application) for the circuitry on the flexible film 6, compatibility with the manufacturing process used to make the circuitry on the flexible film 6, compatibility with the spacers 10 and C-4's which it is intended to bond to the pads 11 and 16, respectively, and other such factors. Relative to the spacing between the outer lead bonding pads 11, they should be spaced such that the spacers 10 will not touch (electrically short) when the spacers 10 are bonded onto the pads 11. This same consideration regarding spacing also applies to the spacing of the inner lead bonding pads 16 to which the controlled collapse chip connections (C-4's) 9 are made.

Similarly, preferably, each of the outer lead bonding pads of the circuitry on the printed circuit board 4 is made of copper, coated with a layer of gold to facilitate the bonding of the spacers 10 to the pads 12. However, if desired, for example, for economic, or for other reasons, the pads 12 may be made of just copper, or they may be made of any one of a variety of other such conductive material(s) which will be readily apparent to one of ordinary skill in the art to which the present invention pertains.

Also, as for the inner lead bonding pads 16, and outer lead bonding pads 11, of the circuitry on the flexible film 6, the outer lead bonding pads 12 of the circuitry on the circuit board 4 may have virtually any desired size, and/or configuration, such as round, oblong, square, rectangular, etc. The considerations relative to the size and configuration of the bonding pads 12 are factors such as the intended use (application) for the circuitry on the circuit board 4, compatibility with the manufacturing process used to make the circuitry on the circuit board 4, compatibility with the spacers 10 which it is intended to bond to the pads 12, and other such factors. Relative to the spacing between the outer lead bonding pads 12, they should be spaced to match the spacing of the outer lead bonding pads 11 on the flexible film 6, and the spacing should be selected (as mentioned above with respect to the spacing of the outer lead bonding pads 11 on the flexible film 6) to ensure that the spacers 10 will not touch (electrically short) when the spacers 10 are bonded onto the pads 12.

As shown in FIGS. 1 and 2, each of the preformed spacers 10 is a cylinder located between the outer lead bonding pads 11 of the circuitry on the flexible film 6 and the bonding pads 12 of the circuitry on the printed circuit board 4. For example, if each of the bonding pads 11 and 12 is generally rectangular with a width of approximately 254.0 micrometers (about 0.010 inch), and a length of approximately 762.0 micrometers (about 0.030 inch), and the combined height (h) of the semiconductor chip 8 and the interposer 7 is approximately 762.0 micrometers (about 0.030 inch), then each of the spacers 10 may be a electrically conductive cylinder having a height of approximately 762.0 micrometers (about 0.030 inch) and a diameter of approximately 254.0 micrometers (about 0.010 inch). However, it should be noted that the spacers 10 may be spherical, or have any one of a number of different shapes.

Regardless of the particular shape selected for the spacers 10, the height of each of the spacers 10 is selected to approximately equal the combined height (h) of the semiconductor chip 8 and the interposer 7 used to backbond the semiconductor chip 8 to the printed circuit board 4. In this manner, the flexible film 6 is supported substantially in a plane by the spacers 10, when the flexible film semiconductor chip carrier 2 is mounted on the circuit board 4. As discussed above, this planar geometry for the flexible film 6 is a very important feature of the present invention since it eliminates and/or alleviates many of the concerns and problems associated with a non-planar ("tent") geometry for the flexible film 6.

Also, it should be noted that the spacers 10 may be made of any one of a variety of different materials, or combinations of different materials, such as solder, copper coated with solder, stainless steel, nickel, or other such electrically conductive material(s). For example, each of the spacers 10 may be a generally spherical solder ball made of approximately ninety-five percent lead (Pb) and five percent tin (Sn) by weight, which is bonded to the outer lead bonding pads 12 on the circuit board 4 using a eutectic Pb/Sn solder. Such spacers 10 made of spherical solder balls of approximately 95%-Pb/5%-Sn provide several advantages. For example, the compliancy, thermal reliability, and fatigue life of joints made with the 95%Pb/5%-Sn solder balls is increased relative to joints, for example, made with copper balls coated with an eutectic Pb/Sn solder. Also, the 95%Pb/5%-Sn solder balls may be joined to the outer lead bonding pads 11 on the flexible film 6 at the same time the semiconductor chip 8 is mounted on the flexible film 6 using the C-4's 9. In addition, the flexible film semiconductor chip carrier 2, with the 95%Pb/5%-Sn solder balls and the semiconductor chip 8 mounted on the flexible film 6 of the carrier 2, may be mounted on the printed circuit board 4 by soldering with a lower melting temperature solder so that there is no need to heat the C-4's 9 between the semi conductor chip 8 and the inner lead bonding pads 16 on the flexible film 6 to a temperature which could loosen the C-4's 9 when mounting the chip carrier 2 on the printed circuit board 4. Further, use of 95%Pb/5%-Sn solder balls as the spacers 10 simplifies rework of the electronic packaging structure after the flexible film semiconductor chip carrier 2 is mounted on the printed circuit board 4 since the 95%Pb/5%-Sn solder balls will remain attached to the flexible film 6 when the flexible film semiconductor chip carrier 2 is removed from the printed circuit board 4 for rework. This eliminates the need for first removing the flexible film semiconductor chip carrier 2 from the printed circuit board 4 and then removing the material forming the spacers 10 from the printed circuit board 4, which otherwise may be necessary to facilitate the rework if the spacers 10 are made of a material other than 95%Pb/5%-Sn solder balls. Also, the 95%Pb/5%-Sn solder balls are relatively inexpensive compared to, for example, solder coated copper balls.

However, for some applications, it may be desirable to use spacers 10 made of material(s) other than 95%Pb/5%-Sn, such as copper wires coated with a eutectic Pb/Sn solder (37% Pb/63% Sn). For example, the spacers 10 may comprise a generally cylindrical copper wire having a diameter of approximately 254.0 micrometers (about 0.010 inch), and a height of approximately 762.0 micrometers (about 0.030 inch), coated with a eutectic Pb/Sn solder having a thickness of approximately 50.8 micrometers (about 0.002 inch). Compared to 95%Pb/5%-Sn solder balls, such solder coated copper wires have advantages such as higher electrical conductivity, and better dimensional stability. Also, it is easier to make such solder coated copper wires with uniform dimensions than it is to make such 95%Pb/5%-Sn solder balls with uniform dimensions.

Figure 3:
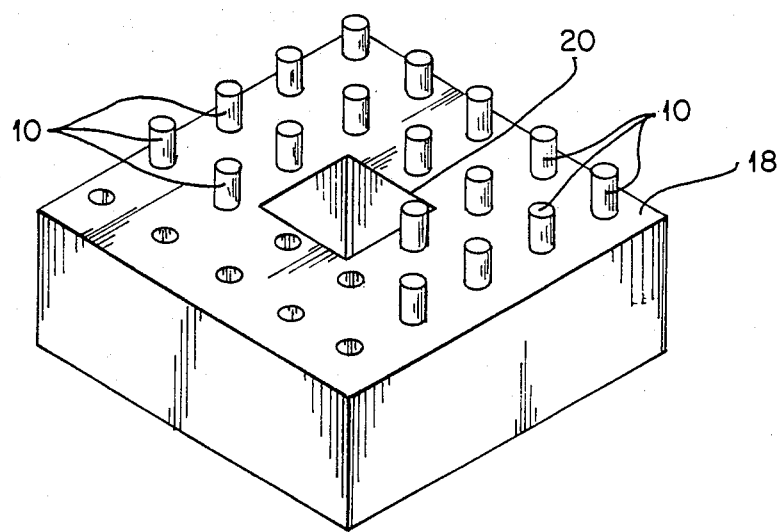
FIG. 3 is a perspective view of the preformed spacers embedded in the removable holder shown in FIG. 1.

Referring to FIG. 3, a perspective view is shown of the removable holder 18 for holding the preformed spacers 10 in position when bonding (attaching) the spacers 10 to the outer lead bonding pads 11 on the flexible film 6 of the semiconductor chip carrier 2, and to the corresponding (matching) outer lead bonding pads 12 on the printed circuit board 4, according to the principles of the present invention. It should be noted that the preformed spacers 10 can be supported (embedded) in the holder 18 in virtually any desired pattern. As shown in FIGS. 1-3, the holder 18 is a slab (sheet) of material with each of the cylindrical spacers 10 embedded in the holder 18 with the longitudinal axis of each of the spacers 10 substantially perpendicular to the plane of the holder 18. As will be readily apparent to one of ordinary skill in the art to which the present invention pertains, the exact configuration of the holder 18 with the spacers 10 may vary depending on the particular application.

If desired, in certain situations, the holder 18 may also be used to hold the semiconductor chip 8 in position when bonding (attaching) the semiconductor chip 8 to the inner lead bonding pads 16 on the flexible film 6 of the semiconductor chip carrier 2. For example, with the semiconductor chip 8 and the spacers 10 held in position by the holder 18, an optical pattern recognition system may be used to exactly align the C-4's 9 on the semiconductor chip 8, and the spacers 10, with the inner lead bonding pads 16, and the outer lead bonding pads 11, respectively, of the circuitry on the flexible film 6 of the flexible film semiconductor chip carrier 2. It is necessary to exactly align the C-4's 9 with the inner lead bonding pads 16 because, with the semiconductor chip 8 held in position by the holder 18, the self aligning capability of the C-4's 9 on the semiconductor chip 8 relative to the inner lead bonding pads 16 is reduced relative to conventional methods of making C-4 interconnections between a semiconductor chip and its bonding pads. Then, this assembly can be heated to bond the C-4's 9 on the chip 8, and the spacers 10, to their respective inner and outer lead bonding pads 16 and 11, on the flexible film semiconductor chip carrier 2. For ease of illustration in FIG. 3, only an opening in the holder 18 for accommodating the semiconductor chip 8 is shown, and the semiconductor chip 8 itself is not shown. Also, for ease of illustration in FIG. 3, only some of the preformed spacers 10 are shown supported in the holder 18. However, it should be understood that each of the openings in the holder 10 (except the opening 20) shown in FIG. 3 is designed to hold one of the spacers 10.

Preferably, the holder 18 is constructed from a single piece of material, such as polysulfone foam, which can be chemically dissolved and washed away (removed) when it is desired to do so. However, if desired, the holder 18 may be constructed in a different way and/or may be made of a different material(s). For example, the holder 18 may be constructed from multiple pieces of material, or the holder 18 may be made of a material such as a sheet (film) of dissolvable flux. An important feature of the holder 18 is that it be removable, preferably dissolvable, by chemical, mechanical, or other such means, compatible with the specific electronic packaging structure which it is desired to make using the holder 18, and with the processes used in making this structure.

As shown in FIG. 3, the holder 18 is sized and shaped to match the size and shape of the flexible film 6 on which the semiconductor chip 8 and the spacers 10 are to be attached. For example, if the flexible film 6 is an approximately two inch square polyimide film, and it is desired to mount cylindrical spacers 10, each each having a height of approximately 762.0 micrometers (about 0.030 inch), on the outer lead bonding pads 11 of the flexible film 2, then the holder 18 may be an approximately two inch square sheet of polysulfone foam having a thickness of approximately 635.0 micrometers (about 0.025 inch). The pattern of the spacers 10 in the holder 18 is designed to match the pattern of the outer lead bonding pads 11 on the flexible film 6 of the flexible film semiconductor chip carrier 2 to which it is desired to attach the spacers 10, and the corresponding (matching) pattern of the bonding pads 12 on the printed circuit board 4 on which the semiconductor chip carrier 2 is to be mounted. Also, the opening 20 in the holder 18 is designed to accommodate and locate the semiconductor chip 8 relative to the inner lead bonding pads 16 of the flexible film 6 to facilitate mounting the semiconductor chip 8 on the inner lead bonding pads 16 of the flexible film 6 using the C-4's 9 shown in FIG. 1. Alternatively, the opening 20 may simply provide a clearance hole for the semiconductor chip 8 which may be mounted on the flexible film 6 by another method prior to attaching the spacers 10 to the outer lead bonding pads 11 of the flexible film 6 using the holder 18 according to the principles of the present invention.

The method according to the present invention for outer lead bonding the flexible film semiconductor chip carrier 2 onto the printed circuit 4, is as follows. First, the spacers 10 are positioned (embedded) in the holder 18. For example, if the holder 18 is made of polysulfone foam, and each of the spacers 10 is a solder cylinder with a copper core, then each of the cylindrical spacers 10 may be simply inserted into position in the holder 18 with the longitudinal axis of each spacer 10 substantially perpendicular to the plane of the holder 18. Then, a solder flux, such as a rosin mildly activated flux (RMA flux), is applied to the spacers 10 in the removable holder 18, and to the outer lead bonding pads 11 on the circuitized, flexible film 6 6 of the flexible film semiconductor chip carrier 2. After applying the flux, the holder 18 with the spacers 10 is located over the flexible film semiconductor chip carrier 2 with the spacers 10 in the holder 18 optically aligned, and in contact, with the outer lead bonding pads 11 on the circuitized, flexible film 6 of the carrier 2. Also, at this time, the semiconductor chip 8 may be inserted into the opening 20 in the holder 18, and the C-4's 9 of the semiconductor chip 8 may be aligned, and brought into contact, with the inner lead bonding pads 16 on the circuitized, flexible film 6, if the holder 18 is designed to carry (hold) the semiconductor chip 8 for this purpose. Alternatively, the semiconductor chip 8 may have been previously mounted on the inner lead bonding pads 16 of the circuitry on the flexible film 6 using a conventional process such as solder reflow.

After positioning the holder 18 with the spacers 10 on the outer lead bonding pads 11 of the circuitry on the flexible film 6 of the flexible film semiconductor chip carrier 2, this entire assembly is heated, for example, in a conventional solder reflow oven, to reflow the solder of the spacers 10 on the outer lead bonding pads 11 of the flexible film 6 thereby bonding the spacers 10 to the outer lead bonding pads 11. At this time, if the C-4's 9 on the semiconductor chip 8 are not already bonded to the inner lead bonding pads 16 (C-4 pads) of the circuitized, flexible film 6, then they may also be reflowed to bond each of the C-4's 9 to its corresponding inner lead bonding pad 16. After the foregoing reflow operation, the flexible film semiconductor chip carrier 2, with the spacers 10 and semiconductor chip 8 in the holder 18 bonded thereto, is cooled, for example, by removing this structure from the reflow oven and allowing the structure to cool to room temperature. After cooling this structure, the interposer 7 may be attached to the top of the semiconductor chip 8 using thermally conductive epoxy, as discussed previously, if it is desired to utilize such an interposer 7. This structure is then ready for mounting on the printed circuit board 4, or other such second level electronic package.

Next, according to the principles of the present invention, the flexible film semiconductor chip carrier 2, with the spacers 10 and the semiconductor chip 8 in the holder 18 bonded thereto, is mounted on the printed circuit board 4, as follows. First, solder flux, such as a rosin mildly activated flux (RMA flux) is applied to the bonding pads 12 of the circuitry on the printed circuit board 4, which may have been previously coated with solder (tinned) according to conventional practice. Also, at this time, the area on the surface of the circuit board 4 on which the interposer 7 is to be mounted is tinned and fluxed. Then, the previously described structure of the flexible film semiconductor chip carrier 2, with the spacers 10 and the semiconductor chip 8 in the holder 18 bonded (mounted) thereto, is positioned over the printed circuit board 4 with each of the spacers 10 in contact with its corresponding matching bonding pad 12 on the circuit board 4, and with the interposer 7 on top of the semiconductor chip 8, in contact with the surface of the printed circuit board 4. Preferably, this positioning is accomplished using a fixture such as described in the previously referenced U.S. patent application Ser. No. 024,499 entitled "Method and Apparatus For Mounting A Flexible Film Semiconductor Chip Carrier On A Circuitized Substrate", which is being filed in the U.S. Patent and Trademark Office on the same day as the present patent application, which is assigned to International Business Machines Corporation as is the present patent application, and which is incorporated herein by reference. However, any suitable positioning technique may be used. After the foregoing structure is positioned as desired on the printed circuit board 4, this entire assembly is heated to bond the spacers 10 to the bonding pads 12 of the circuitry on the printed circuit board 4, and to bond the interposer 7 on top of the semiconductor chip 8 to the surface of the printed circuit board 4. The assembly may be heated using any suitable technique, for example, the assembly may be heated in a conventional vapor phase solder reflow machine.

After the spacers 10 are bonded to the outer lead bonding pads 11 of the circuitry on the flexible film 6 of the semiconductor chip carrier 2, and to the corresponding bonding pads 12 of the circuitry on the surface of the circuit board 4, and the interposer 7 is bonded to the surface of the circuit board 4, as described above, then this assembly is cooled to leave the printed circuit board 4 with the flexible film semiconductor chip carrier 2 mounted thereon, with the flexible film 6 of the carrier 2 supported by the spacers 10 substantially in a plane above the surface of the circuit board 4, as desired. Then preferably, as discussed previously, the holder 18 is removed by dissolving and washing it away. For example, as discussed previously, if the holder 18 is made of polysulfone foam, then the holder 18 can be dissolved and washed away in a conventional vapor degreaser, using a liquid such as methylene chloride. The time and temperature of exposure, and other such parameters, for operating the vapor degreaser can be readily determined by one of ordinary skill in the art to which the present invention pertains, depending on factors such as the mass of the polysulfone foam holder 18 which it is desired to remove and wash away. Alternatively, if desired, the holder 18 may be removed using a different chemical, mechanical, or other such suitable technique. Then, if not removed previously, the frame 3 for the flexible film semiconductor chip carrier 2 may be cut away, or otherwise suitably removed, unless some further use is to be made of the frame 3 after the carrier 2 has been mounted on the circuit board 4, as discussed previously.

Several advantages of the foregoing method and apparatus for mounting a flexible film semiconductor chip carrier 2 on a printed circuit board 4, and of the resulting electronic packaging structure, according to the principles of the present invention, should be noted. First, this method and apparatus according to the present invention allows the flexible film semiconductor chip carrier 2 to be mounted on the printed circuit board 4 in a planar geometry, rather than in a non-planar ("tent") geometry. As discussed previously, the planar geometry is preferred over a tent geometry for a number of reasons, such as allowing for easier cleaning under the carrier 2 once it is mounted on the board 4, making it easier to align the outer lead bonding pads 11 of the circuitry on the flexible film 6 of the semiconductor chip carrier 2 with the bonding pads 12 of the circuitry on the printed circuit board 4, eliminating undesirable stresses associated with the tent geometry, and eliminating electrical shorting between the carrier 2 and the edges of the semiconductor chips 8. Also, the method and apparatus according to present invention are easy and simple to use, and are suitable for use in a manufacturing environment. In addition, an especially unique feature of the electronic packaging structure described above according to the principles of the present invention, is the closeness of the circuitized, flexible film 6 wiring plane to the printed circuit board 4 which includes the ground return for the wires (circuit lines) on the flexible film 6. That is, the height of the wiring plane of the circuitized, flexible film 6 above the printed circuit board 4 is quite small compared to almost all other semiconductor chip mounting schemes except DCA (direct chip attach). The significance of this is that electronic package inductance is reduced as the "loop" area between a wire (circuit line) and its ground return is reduced. This reduced inductance improves high frequency characteristics of the circuit lines, and increases the number of simultaneous switched circuit lines which can be used, for example, in a digital computer application. Of course, the foregoing features and advantages of the present invention are intended to be an illustrative, and not an exhaustive, list of such features and advantages.

Also, it should be noted that, although the method and apparatus according to the present invention have been described relative to mounting a flexible film semiconductor chip carrier 2 in a planar geometry on a printed circuit board 4, and although this is the preferred way of practicing the present invention, as will be apparent to one of ordinary skill in the art to which the present invention pertains, if desired, the method and apparatus according to the present invention may also be used to mount the flexible film semiconductor chip carrier 2 in a non-planar geometry on the circuit board 4, or other such second level electronic package, by adjusting the size of the spacers 10.

Finally, it should be noted that the foregoing description is directed to one particular embodiment of the present invention and various modifications and other embodiments of the present invention will be apparent to one of ordinary skill in the art to which the present invention pertains. Therefore, while the present invention has been described in conjunction with a particular embodiment it is to be understood that these various modifications and other embodiments of the present invention may be made without departing from the scope of the present invention as described herein and as claimed in the appended claims.

What is claimed is:

1. A method for outer lead bonding a circuitized, flexible sheet of polyimide film having a thickness of less than approximately 127.0 micrometers (about 0.005 inch) which is mounted on a frame and which is carrying an electronic device, onto a circuitized substrate having mounting pads thereon in a pattern matching a corresponding pattern of outer lead bonding pads on the circuitized, flexible film, which comprises the steps of:
    attaching electrically conductive spacers embedded in a removable holder to the outer lead bonding pads on the circuitized, flexible film, said holder having an opening for accommodating the electronic device carried by the flexible film, and said spacers sized and configured to physically support the circuitized, flexible film substantially in a plane above the surface of the circuitized substrate with the electronic device carried by the flexible film in thermal contact with the circuitized substrate, when the circuitized, flexible film is mounted on the circuitized substrate;
    positioning the circuitized, flexible film having the spacers attached thereto, on the circuitized substrate, with each of the spacers in contact with its corresponding bonding pad on the circuitized substrate; and
    bonding the spacers to the bonding pads of the circuitized substrate whereby the circuitized, flexible film is mounted on the circuitized substrate.

2. A method for outer lead bonding as recited in claim 1, further comprising the step of removing the holder after the step of bonding the spacers to the bonding pads on the circuitized substrate.

3. A method for outer lead bonding as recited in claim 1, wherein the holder comprises polysulfone foam.

4. A method for outer lead bonding as recited in claim 3, further comprising the step of removing the polysulfone foam holder after the step of bonding the spacers to the bonding pads on the circuitized substrate.

5. A method for outer lead bonding as recited in claim 4, wherein the step of removing the polysulfone foam holder comprises dissolving and washing away the holder.

6. A method for outer lead bonding as recited in claim 5, wherein the step of dissolving and washing away the polysulfone foam holder comprises immersing the holder in methylene chloride.

7. A method for outer lead bonding as recited in claim 1, wherein each of the spacers comprises a solder cylinder with a copper core.

8. A method for outer lead bonding as recited in claim 7, wherein the step of attaching the spacers to the outer lead bonding pads on the circuitized, flexible film, comprises:
    placing flux on the spacers in the holder and/or on the outer lead bonding pads on the circuitized, flexible film;
    positioning each of the spacers in the holder on its corresponding outer lead bonding pad on the circuitized, flexible film; and
    reflowing the solder part of the spacers to bond the spacers to the outer lead bonding pads on the circuitized, flexible film.

9. A method for outer lead bonding as recited in claim 7, wherein the step of bonding the spacers to the bonding pads of the circuitized substrate, comprises:
    placing flux on the bonding pads of the circuitized substrate;
    positioning each of the spacers in the holder on its corresponding bonding pad on the circuitized substrate; and
    reflowing the solder portion of the spacers to bond the spacers to the bonding pads on the circuitized substrate.

10. A method for outer lead bonding as recited in claim 9, further comprising the step of removing the holder after the step of reflowing the solder portion of the spacers to bond the spacers to the bonding pads on the circuitized substrate.

* * * * *